US006340110B1

(12) United States Patent
Nakamura et al.

(10) Patent No.: US 6,340,110 B1
(45) Date of Patent: Jan. 22, 2002

(54) METHOD AND APPARATUS FOR SOLDERING PRINTED CIRCUIT BOARDS AND COOLING MECHANISM FOR A SOLDERING APPARATUS

(75) Inventors: Hideki Nakamura, Koshigaya; Shohei Mawatari, Soka, both of (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 09/506,601

(22) Filed: Feb. 18, 2000

(30) Foreign Application Priority Data

Feb. 22, 1999 (JP) .............................. 11-043086

(51) Int. Cl.⁷ .............................................. B23K 31/02
(52) U.S. Cl. .............................. 228/179.1; 228/180.21; 228/234.1
(58) Field of Search .................... 228/179.1, 123.1, 228/46, 200, 180.21, 234.1

(56) References Cited

U.S. PATENT DOCUMENTS

| 3,500,536 A | * | 3/1970 | Goldschmied |
| 4,115,601 A | * | 9/1978 | Ammann et al. |
| 4,332,342 A | * | 6/1982 | van Der Put |
| 4,361,967 A | * | 12/1982 | Bahnsen et al. |
| 4,679,721 A | * | 7/1987 | Kondo |
| 4,805,828 A | * | 2/1989 | Witherell et al. |
| 4,805,831 A | * | 2/1989 | Lipschutz |
| 5,542,596 A | * | 8/1996 | Cimbak |

FOREIGN PATENT DOCUMENTS

| JP | 6444265 | 2/1989 |
| JP | 463491 | 2/1992 |

* cited by examiner

*Primary Examiner*—Tom Dunn
*Assistant Examiner*—Jonathan Johnson
(74) *Attorney, Agent, or Firm*—Michael Tobias

(57) ABSTRACT

A printed circuit board which has been soldered in a molten solder bath is cooled immediately thereafter with a cooling liquid at a rate of at least 10° C./second. Thermal effects of high-temperature solder during soldering are suppressed, and the metal matrix of the solder is refined, resulting in soldered connection of increased strength.

19 Claims, 4 Drawing Sheets

METHOD AND APPARATUS FOR SOLDERING PRINTED CIRCUIT BOARDS AND COOLING MECHANISM FOR A SOLDERING APPARATUS

BACKGROUND OF THE INVENTION

1. Field of the Invention

This invention relates to a method and apparatus for soldering printed circuit boards, and to a cooling mechanism for use within a soldering apparatus to cool solder which has been applied to printed circuit boards by the soldering apparatus.

2. Description of the Related Art

In general, Pb-63Sn, which is a eutectic solder, is used as a solder alloy for the soldering of electronic components printed circuit boards. This eutectic solder has a low liquidus temperature at which it melts of 183° C., so when soldering of printed circuit boards is carried out using molten solder in a solder bath, the temperature of the molten solder is generally around 210° C. At this temperature, the molten solder has little thermal effect on printed circuit boards or on electronic components mounted on the printed circuit boards.

However, eutectic solder is not suitable for use with all printed circuit boards. Some electronic components which are mounted on printed circuit boards, such as power transistors and high-voltage coils, generate significant heat during their operation and reach a high temperature which can melt or weaken soldered joints made of eutectic solder. To prevent thermal damage of this type, high-temperature solders which will not melt or weaken when exposed to high temperatures from electronic components are often used to solder electronic components having a high power consumption to printed circuit boards.

Typical high-temperature solders are lead-based solders to which small amounts of tin, silver, antimony, etc. have been added, and tin-based solders to which small amounts of lead, silver, antimony, etc. have been added. As indicated by their name, high-temperature solders have a melting point and particularly a high liquidus temperature which is generally at least 220° C. With such a high liquidus temperature, the soldering temperature for high-temperature solders must typically be at least 250° C., so a bath containing molten solder of this type cannot be used for soldering of printed circuit boards on which heat-sensitive electronic components are mounted.

Recently, the use of lead-free solders has been studied to avoid the problems of lead pollution. Lead-free solders contain tin as a main component, to which is added silver, copper, nickel, or other metals with a high melting point. If only such high-temperature metals are added, the melting point of the solder may be too high, so metals with a low melting point such as bismuth or indium may also be added to lower the melting point of lead-free solders.

The addition of metals such as Bi and In to lead-free solders does in fact lower their solidus temperature, but the liquidus temperature does not significantly decrease and remains at a high level of at least 200° C.

The temperature for soldering is generally 20–50° C. above the liquidus temperature of a solder, so even if the solidus temperature of lead-free solder is lowered, the soldering temperature is still a high level of at least 220° C. Accordingly, even with lead-free solders, it has not been possible to perform soldering of printed circuit boards equipped with heat-sensitive components using a molten solder bath.

A degradation in the properties of heat-sensitive electronic components usually requires prolonged exposure to high temperatures. Exposure to high temperatures will not result in degradation provided the exposure is for a short period. Therefore, thermal damage to heat-sensitive components during the soldering of printed circuit boards can be avoided by completing soldering in as short a time as possible, by individually soldering the components by hand to minimize thermal effects, or by cooling the solder as rapidly as possible after the completion of soldering.

There exist soldering apparatuses in which a fluxer, a preheater, a molten solder bath, a cooling mechanism, and other processing equipment are arranged in series. The cooling mechanism employs a fan to cool printed circuit boards after soldering by blowing air at the printed circuit boards. However, the purpose of cooling by the cooling mechanism is to cool the printed circuit boards themselves and not to prevent thermal effects on heat-sensitive electronic components mounted on printed circuit boards. In actuality, a fan-type cooling mechanism for cooling printed circuit boards cannot cool faster than 10° C./second, no matter how cold is the air that it blows, so when heat-sensitive electronic components which have been soldered at a high temperature are cooled with a fan-type cooling mechanism, the performance of the components ends up deteriorating due to prolonged exposure to high temperatures.

SUMMARY OF THE INVENTION

The present invention provides soldering technology which does not cause deterioration of electronic components even when soldering is carried out in a molten solder bath using high-temperature solder or lead-free solder.

The present inventors found that if a printed circuit board is rapidly cooled by a cooling liquid after soldering, not only does the rapid cooling prevent the adverse effects of heat, but it also refines the metal matrix of the solder to improve its strength.

The present invention provides a soldering method for printed circuit boards in which molten solder is applied to a printed circuit board, and then the printed circuit board is made to contact a cooling liquid to rapidly cool the solder.

The present invention also provides a soldering apparatus for printed circuit boards equipped with a molten solder bath and a cooling mechanism which can contact a printed circuit board with a cooling liquid after the application of molten solder to the printed circuit board.

The present invention additionally provides a cooling mechanism for use with a soldering apparatus. The cooling mechanism includes a tank for containing a cooling liquid and a discharge port for discharging the cooling liquid at a printed circuit board. In a preferred embodiment, the cooling mechanism is equipped with a chiller which can cool cooling liquid from the tank.

When soldering is performed with a conventional soldering method using high-temperature solder or lead-free solder, if the solder which has been applied to a printed circuit board is exposed to heat cycles of alternating high and low temperatures, the solder undergoes metal fatigue, and cracking and peeling of the solder may occur. However, according to the present invention, the metal matrix of the solder is refined by rapid cooling which takes place after soldering, so the strength of the solder is increased, and metal fatigue due to heat cycles is prevented.

Many high-temperature lead-based solders and lead-free, tin-based solders have a large solidification region, which is the region between their solidus temperature and their liquidus temperature. When soldering is performed using a solder with a large solidification region, it takes a long time for the solder adhering to printed circuit boards to completely solidify. During this period of solidifying, if the printed circuit board is subjected to vibrations or shocks, cracking or peeling of solder which is in the process of hardening can take place, resulting in defective soldered connections. However, according to the present invention, cooling of solder can take place at an extremely high rate, so the occurrence of such cracking and peeling is extremely rare.

Lead-free solder has poorer solderability than eutectic solder. This is due not only to the properties of lead-free solder itself but also to the fact that if soldering of a tin-based solder is carried out in the air, the solder becomes easy to oxidize, and its solderability worsens. Therefore, soldering using a lead-free solder is preferably carried out in an atmosphere without oxygen, i.e., in a nonreactive gas atmosphere. However, in this case, since it is not possible to introduce fresh cooling air from outside a chamber in which soldering is taking place, a fan-type cooling mechanism which simply blows gas within the chamber at printed circuit boards cannot perform adequate cooling. As a result, the above-described problems of cracking and peeling due to inadequate cooling occur. In contrast, according to the present invention, printed circuit boards can be rapidly cooled even in a closed chamber, so cracking and peeling of solder do not occur.

DESCRIPTION OF PREFERRED EMBODIMENTS

Figure 1:
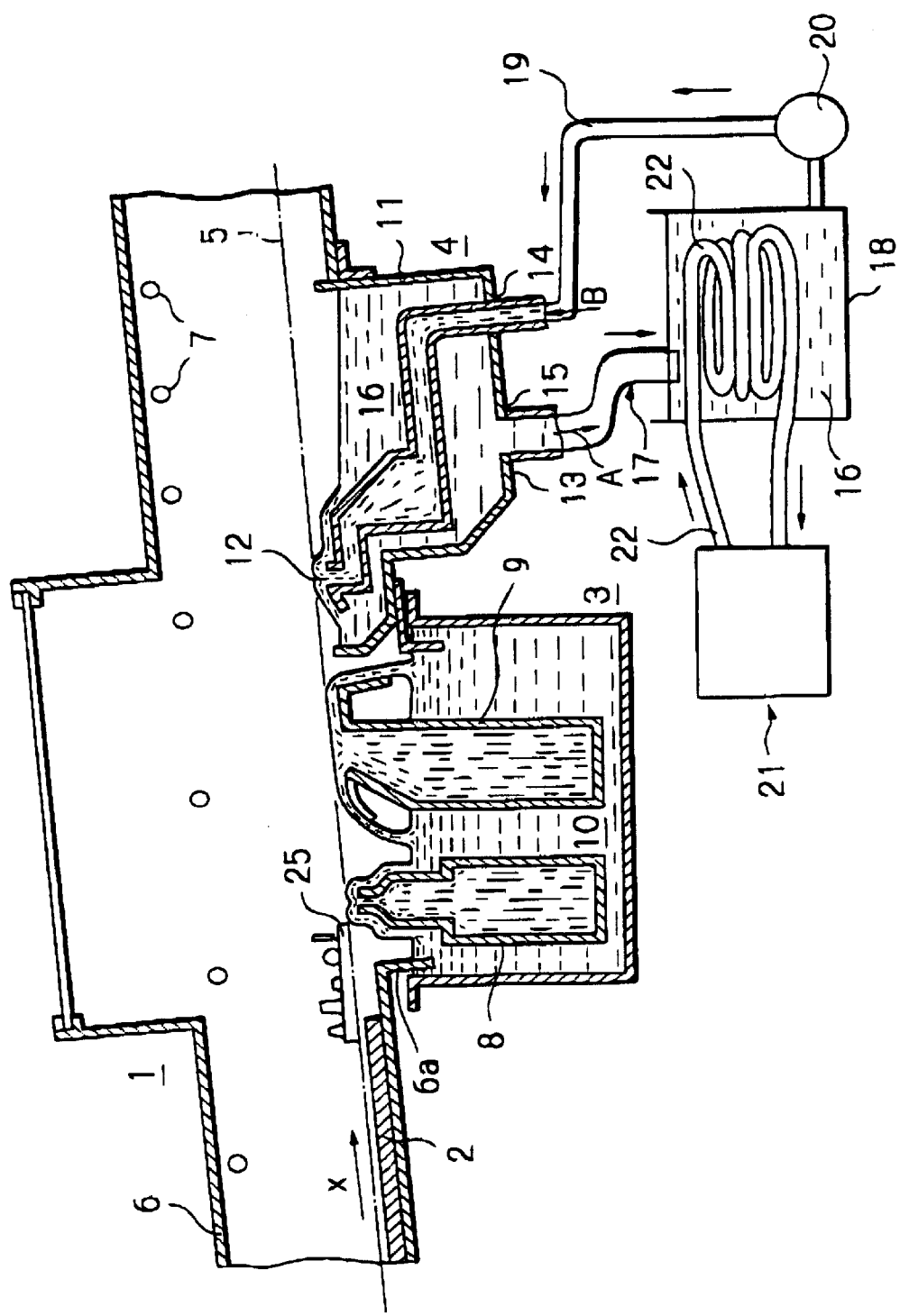
FIG. 1 is a cross-sectional side elevation of an embodiment of a soldering apparatus according to the present invention.

According to one aspect of the present invention, a soldering method includes applying molten solder to a printed circuit board, and then rapidly cooling the applied solder by contacting it with a cooling liquid. A soldering method according to the present invention can be employed with any type of solder, but the advantages of this method with respect to conventional soldering methods are particularly pronounced when the solder which is employed is one having a liquidus temperature of at least 200° C., since it is with such solders that problems such as cracking and peeling due to slow cooling are more likely to occur. Thus, an embodiment of a soldering method according to the present invention will be described for the case in which the method employs a solder with a liquidus temperature of at least 200° C. If the liquidus temperature of the solder is at least 200° C., the soldering temperature, i.e., the temperature of molten solder within a molten solder bath will typically be at least 220° C. Solder alloys having a liquidus temperature of at least 200° C. include many high-temperature solders and lead-free solders.

Superior results can be obtained if the cooling rate of solder produced by the cooling liquid following soldering is at least 10° C./second. More preferably, the cooling rate is at least 25° C./second. Depending upon the soldering conditions, a still higher cooling rate may be suitable, such as at least 50° C./second or at least 100° C./second, such as 100–200° C./second. If cooling is carried out at a high rate of at least 10° C./second, a phenomenon similar to that occurring during the quenching of steel products takes place, and the metal matrix of the solder being thus cooled is refined. However, if the cooling rate following soldering is less than 10° C./second, no significant refining of the metal matrix takes place. Furthermore, if the cooling rate is too low, cracking and peeling of solder develop if the printed circuit board vibrates even a little after soldering.

The temperature of cooling liquid necessary to achieve a cooling rate of at least 10° C./second will depend upon a number of factors, including the flow rate of the cooling liquid, but in general, the temperature of the cooling liquid is preferably at most 60° C.

The cooling liquid used in the present invention is preferably one which is compatible with printed circuit boards and solder, i.e., one which will not corrode the solder being used or decrease the insulation resistance of printed circuit boards after soldering. Examples of such cooling liquids include chlorofluorocarbon substitutes, oils, solvents with a high boiling point, and water. Chlorofluorocarbon substitutes (such as that sold under the trade name AK-225) are particularly advantageous because they instantly vaporize after soldering, so they do not adhere to or get transported by printed circuit boards which they are used to cool, and they do not contaminate the work environment by dripping from the printed circuit boards. In addition, chlorofluorocarbon substitutes can clean off flux adhering to printed circuit boards after soldering, so they can increase the reliability of the printed circuit boards by removing contaminants.

Figure 2:
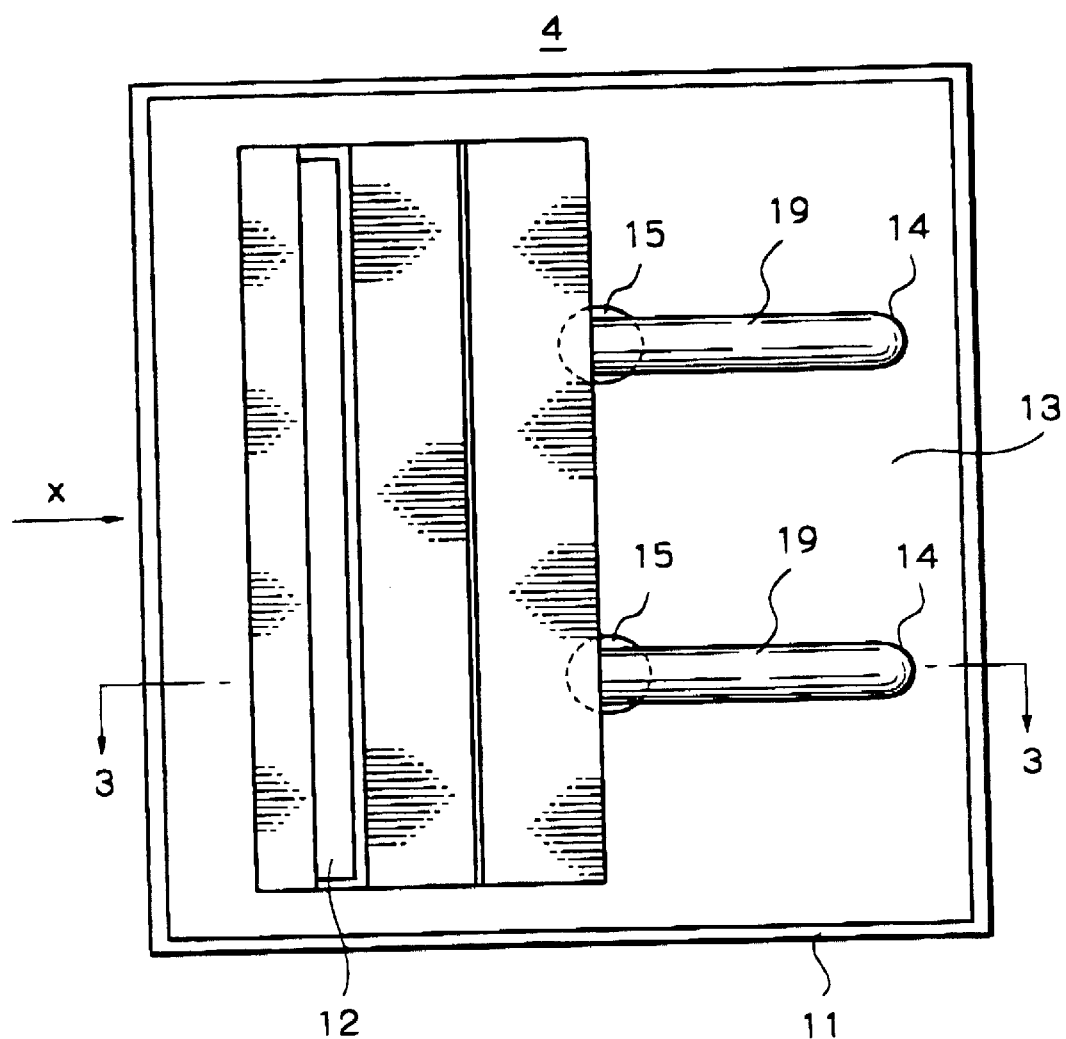
FIG. 2 is a plan view of a portion of the cooling mechanism of the embodiment of FIG. 1.
Figure 3:
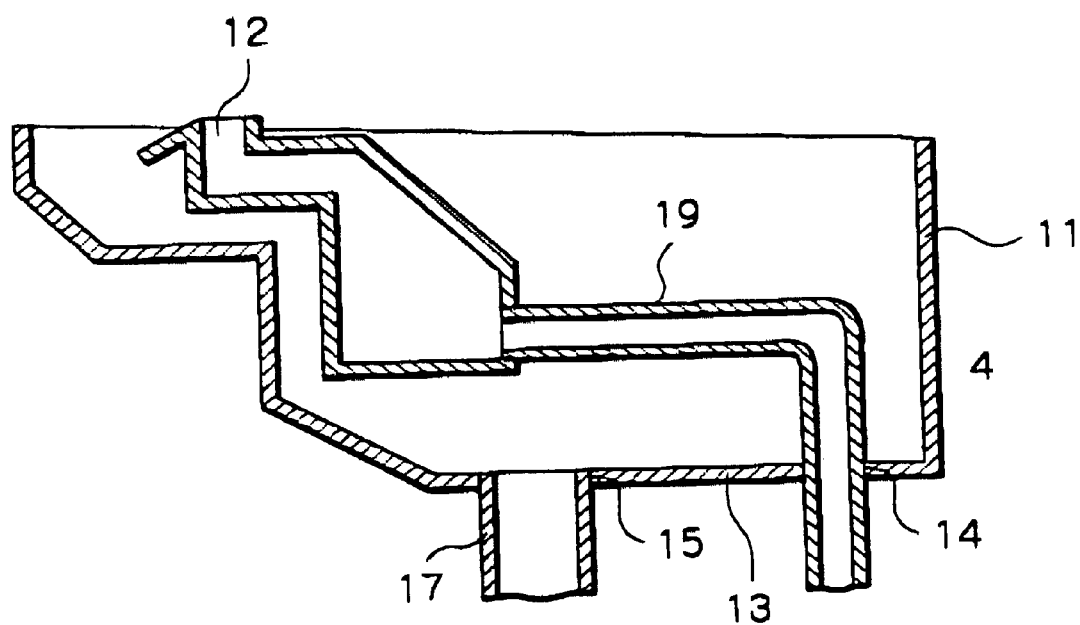
FIG. 3 is a cross-sectional view taken along line 3—3 of FIG. 2.

FIGS. 1–3 illustrate an embodiment of a soldering apparatus 1 according to the present invention. FIG. 1 is a cross-sectional side elevation of the embodiment, FIG. 2 is a plan view of a portion of the cooling mechanism of this embodiment, and FIG. 3 is a cross-sectional view taken along line 3—3 of FIG. 2. As shown in these figures, the soldering apparatus 1 includes a preheater 2, a molten solder bath 3, and a cooling mechanism 4 arranged in series within a tunnel-like chamber 6. The soldering apparatus 1 may, if desired, include other conventional processing equipment. Printed circuit boards 25 being soldered are transported through the chamber 6 in the direction indicated by arrow X by a conveyor 5 (schematically illustrated by a dashed line). An unillustrated fluxer is installed on the upstream side of the preheater 2 (on the left side in FIG. 1) so that printed circuit boards 25 can be transported continuously from the fluxer to the preheater 2. The fluxer may be installed either on the interior or the exterior of the chamber 6. The chamber 6 is preferably equipped with one or more gas supply pipes 7 for supplying a nonreactive gas such as nitrogen to the interior of the chamber 6 to create a nonreactive gas atmosphere. The fluxer, the preheater 2, the molten solder bath 3, the conveyor 5, and the chamber 6 may all be of conventional structure well known to those skilled in the art, so they are illustrated here only schematically.

Molten solder may be applied to printed circuit boards 25 being transported by the conveyor 5 in any desired manner by a variety of known mechanisms. The molten solder bath 3 shown in FIG. 1 is of a well-known type referred to as a double wave solder bath in which a primary jet nozzle 8 which discharges a turbulent wave of molten solder and a secondary jet nozzle 9 which discharges a laminar wave of molten solder are installed within the molten solder bath 3. A downwardly extending skirt 6a of the chamber 6 may be immersed in molten solder 10 within the molten solder bath 3 to maintain the chamber 6 airtight regardless of variations in the height of the molten solder bath 3 relative to the chamber 6.

The cooling mechanism 4 may be any type of mechanism capable of contacting a printed circuit board 25 which has been soldered in the molten solder bath 3 with a cooling liquid. The cooling mechanism 4 is installed on the downstream side of the molten solder bath 3 with respect to the direction of movement X of printed circuit boards 25, and preferably as close as possible to the molten solder bath 3 so that cooling of a printed circuit board 25 can commence immediately after the printed circuit board 25 leaves the molten solder bath 3. The cooling mechanism 4 can be configured in many different ways, but generally it will include a structure for discharging a flowing stream of cooling liquid at the portions of a printed circuit board to which solder has been applied. In the present embodiment, the cooling mechanism 4 includes a box-shaped tank 11 which is open at its upper end onto the interior of the chamber 6 and which adjoins the downstream side of the molten solder bath 3. The tank 11 is preferably connected to the chamber 6, either detachably or permanently, in an airtight manner to enable the nonreactive gas atmosphere to be maintained within the chamber 6.

Cooling liquid may be used a single time to cool a printed circuit board 25, or it may circulate within a closed system to be used more than once. In the present embodiment, cooling liquid 16 circulates between the tank 11 of the cooling mechanism 4 and an external reservoir 18. Cooling liquid 16 can exit from the tank 11 through one or more discharge conduits 17 which are connected to corresponding outlets 15 formed in a lower portion of the tank 11, such as the bottom surface 13 thereof, and communicate with the reservoir 18. Cooling liquid 16 from within the reservoir 18 can be returned to the tank 11 through one or more return conduits 19 which communicate between the reservoir 18 and a discharge nozzle 12 from which cooling liquid 16 is discharged at the lower surface of a printed circuit board 25 being transported by the conveyor 5. The illustrated embodiment includes two return conduits 19, each of which passes through a corresponding inlet 14 in the tank 11. As shown in FIG. 2, the discharge port 12 in the present embodiment is a rectangular opening elongated in the widthwise direction of the soldering apparatus 1, but other shapes can also be employed for the discharge port 12. The discharge port 12 is preferably located as close as possible to the molten solder bath 3. One or more pumps 20 may be provided to pump cooling liquid from the reservoir 18 through the return conduits 19 to the discharge port 12. For example, a separate pump 20 may be provided for each of the return conduits 19, or both return conduits 19 may be connected to the discharge side of a single pump 20. During normal operation, cooling liquid flows from the outlets 15 in the direction of arrow A and then flows through the inlets 14 to the discharge port 12 in the direction of arrow B. Cooling liquid 16 which is discharged from the discharge port 12 collects within the tank 11 after contacting a printed circuit board 25 and then is flows through the outlets 15 into the reservoir 18.

Since the cooling liquid 16 is heated by contact with printed circuit boards 25 which are initially at a high temperature, the cooling mechanism 4 may include a device for cooling the cooling liquid 16 to a desired temperature after it has been heated. The cooling liquid 16 may be cooled either within or outside of the tank 11. In the present embodiment, the cooling liquid 16 is cooled within the reservoir 18 by a chiller 21.

The chiller 21 may be any type of device capable of cooling the cooling liquid 16 within the reservoir 18 to a desired temperature. For example, it may be a device such as used in conventional refrigeration equipment in which a pressurized liquid refrigerant is made to flow through an evaporator coil in thermal contact with the cooling liquid 16 which is to be cooled. The chiller 21 in the present embodiment is a device of this type, including an evaporator coil 22 which is immersed in the cooling liquid 16 within the reservoir 18. Since the structure of such a chiller is well known to those skilled in the art, the chiller 21 has been illustrated only schematically in the drawings. The chiller 21 can be responsive in a conventional manner to the temperature of the cooling liquid 16 within the reservoir 18 so as to maintain the temperature within a predetermined range. The cooling liquid 16 which enters the reservoir 18 from the discharge conduits 17 undergoes heat exchange with the refrigerant within the evaporator coil 22 and so is cooled before returning to the discharge port 12 via the return conduits 19.

Next, a method of soldering printed circuit boards using the above-described embodiment of a soldering apparatus 1 will be described.

First, the molten solder 10 within the molten solder bath 3 is heated to a prescribed temperature, and then it is discharged from the primary jet nozzle 8 and the secondary jet nozzle 9 as waves. Nitrogen gas is supplied to the interior of the chamber 6 by the gas supply pipes 7, and the oxygen concentration is thereby lowered to a prescribed level.

When the temperature of the molten solder 10 within the molten solder bath 3 and the oxygen concentration in the chamber 6 have reached prescribed levels, flux is applied to a printed circuit board 25 by the unillustrated fluxer, and the printed circuit board 25 is carried by the conveyor 5 in the direction of arrow X. The printed circuit board 25 is preheated by the preheater 2, and then molten solder 10 is applied to the lower surface of the printed circuit board 25 by the primary and secondary jet nozzles 8 and 9 of the molten solder bath 3.

The turbulent wave which is discharged from the primary jet nozzle 8 enables molten solder 10 to penetrate difficult to reach portions of the printed circuit board 25 and prevents the occurrence of unsoldered portions. On the other hand, the turbulence of this wave can cause the occurrence of soldering defects such as bridging and icicle-like pieces of solder hanging from the printed circuit board 25. However, bridging and icicle-like pieces caused by the primary jet nozzle 8 can be removed by the laminar wave from the secondary jet nozzle 9, so soldered joints with no defects can be achieved.

The printed circuit board 25 to which molten solder 10 has been applied is then transported by the conveyor 5 to above the cooling mechanism 4, where it is rapidly cooled, preferably at a rate of at least 10° C./second and more preferably at least 25° C./second.

In the cooling mechanism 4, cooling liquid 16 is discharged from the discharge port 12, and a printed circuit board 25 which is transported by the conveyor 5 passes over the discharge port 12 so that its lower surface is contacted by the discharged cooling liquid 16. At this time, solder adhering to the printed circuit board 25 in either a molten state or a partially solidified state is rapidly cooled by contact with the cooling liquid 16, which is at a low temperature. The printed circuit board 25 is then carried by the conveyor 5 downstream from the cooling mechanism 4, either for further processing by unillustrated equipment or to be discharged from the soldering apparatus 1.

In order to show the effects of the present invention, actual soldering was performed using a soldering apparatus according to the present invention and a conventional soldering apparatus. The soldering apparatus of the present invention had a structure similar to that shown in FIGS. 1–3. The conventional device was similar in its overall structure to the apparatus of the present invention, but it was equipped with a conventional fan-type cooling mechanism instead of the liquid cooling mechanism 4 employed in the present invention.

In both soldering apparatuses, the oxygen concentration in a chamber 6 was maintained at 50 ppm, and a molten solder bath 3 was charged with Sn-Ag-Cu lead-free solder (liquidus temperature=220° C.), which was maintained at 250° C.

Figure 4:
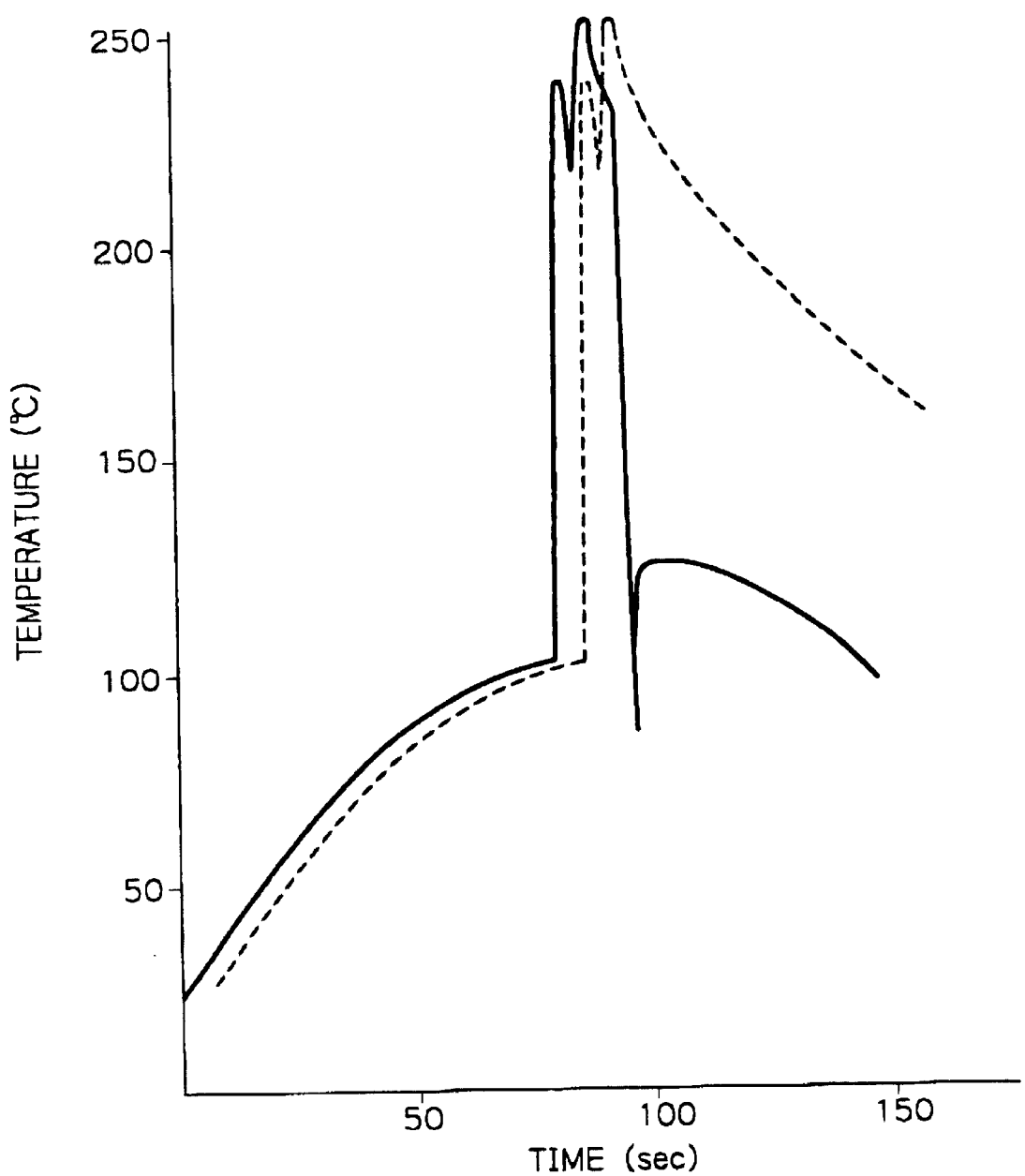
FIG. 4 is a graph showing the temperature profiles of printed circuit boards soldered with a soldering apparatus according to the present invention and with a conventional soldering apparatus.

A thermocouple was mounted on each printed circuit board 25 to be soldered, and the temperature profile of each printed circuit board was charted as it passed through one of the soldering apparatuses. The temperature profiles are shown in FIG. 4.

In the temperature profile of the example of the present invention (the solid line in FIG. 4), the temperature of the printed circuit board 25 jumped to 240° C. when the printed circuit board 25 contacted the molten solder 10 discharged from the primary jet nozzle 8 of the molten solder bath 3, and it fell to 220° C. when the printed circuit board 25 left the solder wave from the primary jet nozzle 8. The temperature then reached a peak of 250° C. when the printed circuit board 25 contacted the molten solder wave discharged from the secondary jet nozzle 9, and when the temperature had decreased to 230° C. when the printed circuit board 25 left the solder wave from the secondary jet nozzle 9, the printed circuit board 25 was contacted with cooling liquid 16 (the chlorofluorocarbon substitute sold under the trade name AK-225) at 5° C. discharged from the discharge port 12 of the cooling mechanism 4, causing the temperature of the printed circuit board 25 to precipitously drop to 80° C. at a cooling rate of approximately 100° C./second. The temperature of the printed circuit board 25 then increased to 130° C. due to remaining heat and thereafter gradually decreased.

On the other hand, the temperature profile in the conventional soldering apparatus (the dashed line in FIG. 4) peaked at 250° C., 5 seconds after which the printed circuit board 25 was cooled by the fan-type cooling mechanism. The temperature of the printed circuit board 25 only gradually decreased and did not reach 150° C. until 60 seconds after the start of cooling by this cooling mechanism.

As is clear from a comparison of the temperature profiles for the soldering apparatus of the present invention and the conventional soldering apparatus, in the present invention, the temperature of printed circuit boards can be much more rapidly decreased after soldering.

After soldering of printed circuit boards 25 was carried out using both soldering apparatuses, the printed circuit boards 25 which had been soldered were subjected to a heat cycle test.

In the heat cycle test, each printed circuit board 25 after soldering was alternatingly exposed to a low temperature atmosphere at −55° C. for 30 minutes and to a high-temperature atmosphere at 125° C. for 30 minutes, and the number of cycles until the occurrence of cracks in the solder was measured.

Printed circuit boards which were soldered using the conventional soldering apparatus had cracks develop after 820 cycles of the heat cycle test, whereas printed circuit boards which were soldered using the soldering apparatus of the present invention underwent 1000 or more cycles without the occurrence of cracking.

As explained above, according to the present invention, even when soldering is carried out at a high temperature as with high-temperature solder or lead-free solder, the temperature of a printed circuit board can be rapidly decreased in a short length of time. Therefore, electronic components can be prevented from suffering a degradation in performance. Furthermore, even when using solder alloys with a large difference between their liquidus and solidus temperatures, the solder can be hardened in a short length of time, so soldered joints of good reliability which do not suffer from cracking or peeling even if subjected to vibrations or shocks during transport can be obtained.

What is claimed is:

1. A method for soldering a printed circuit board comprising applying molten solder to a printed circuit board by contacting the printed circuit board to adhere solder to the printed circuit board and then contacting the solder applied to the printed circuit board with a flowing stream of cooling liquid before the solder has completely solidified to cool the solder, the solder forming soldered joints upon solidification.

2. A method as claimed in claim 1 including contacting the solder with an upwardly flowing stream of the cooling liquid.

3. A method as claimed in claim 1, including cooling the solder at a rate of at least 10° C./second.

4. A method as claimed in claim 1 including cooling the solder at a rate of at least 25° C./second.

5. A method as claimed in claim 1 including cooling the solder at a rate of at least 50° C./second.

6. A method as claimed in claim 1 including cooling the solder at a rate of at least 100° C./second.

7. A method as claimed in claim 1, wherein the cooling liquid is at most 60° C. before contacting the solder.

8. A method as claimed in claim 1 including applying the molten solder to a first side of the printed circuit board and supporting the printed circuit board with the first side facing downwards while contacting the solder with the cooling liquid.

9. A method as claimed in claim 1, wherein the molten solder has a liquidus temperature of at least 200° C.

10. A method as claimed in claim 1 including contacting the solder with the cooling liquid in a nonreactive gas atmosphere.

11. A method as claimed in claim 1 including reusing the cooling liquid after it contacts the solder on the printed circuit board.

12. A method as claimed in claim 11 including collecting the cooling liquid in a tank after the cooling liquid contacts the solder on the printed circuit board, and cooling and reusing the cooling liquid which is collected in the tank.

13. A method as claimed in claim 1 wherein the cooling liquid comprises a chlorofluorocarbon substitute.

14. A method for soldering a printed circuit board comprising applying molten solder to a printed circuit board to adhere the solder to the printed circuit board, contacting the solder applied to the printed circuit board with a cooling liquid before the solder has completely solidified to cool the solder, and reusing the cooling liquid after it contacts the solder on the printed circuit board, the solder which is applied to the printed circuit board forming soldered joints upon solidification.

15. A method as claimed in claim 14 including collecting the cooling liquid after it contacts the solder on the printed circuit board, and cooling and reusing the cooling liquid which is collected.

16. A method as claimed in claim 1 wherein applying the molten solder comprises contacting the printed circuit board with a solder wave to adhere solder to the printed circuit board.

17. A method as claimed in claim 14 wherein applying the molten solder comprises contacting the printed circuit board with a solder wave to adhere solder to the printed circuit board.

18. A soldering apparatus for printed circuit boards including a fluxer which applies flux to a surface of a printed circuit board, a molten solder bath which applies molten solder to the surface of the printed circuit to which the flux has been applied to adhere the solder to the printed circuit board, and a cooling mechanism which contacts the solder which has been applied to the printed circuit board by the molten solder bath with a flowing stream of cooling liquid, the solder which is applied to the printed circuit board forming soldered joints upon solidification.

19. A soldering apparatus as claimed in claim 18 wherein the molten solder bath applies molten solder to the printed circuit with a solder wave to adhere the solder to the printed circuit board.

* * * * *